(12) United States Patent
Lo et al.

(10) Patent No.: US 8,003,528 B2
(45) Date of Patent: Aug. 23, 2011

(54) SEMICONDUCTOR STRUCTURE AND METHOD FOR MAKING THE SAME

(75) Inventors: Yi-Jen Lo, Taipei County (TW); Yu-Shan Chiu, Taipei County (TW); Kuo-Hui Su, Taipei (TW); Chiang-Hung Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 16 days.

(21) Appl. No.: 12/815,407

(22) Filed: Jun. 15, 2010

(65) Prior Publication Data

US 2010/0279498 A1 Nov. 4, 2010

Related U.S. Application Data

(63) Continuation of application No. 12/434,688, filed on May 4, 2009.

(51) Int. Cl.
*H01L 21/443* (2006.01)

(52) U.S. Cl. . 438/656; 438/674; 438/685; 257/E21.168; 257/E21.171

(58) Field of Classification Search ............ 438/648, 438/656, 674, 685; 257/E21.168, E21.171
See application file for complete search history.

(56) References Cited

U.S. PATENT DOCUMENTS

| | | | |
|---|---|---|---|
| 5,126,283 A | 6/1992 | Pintchovski | |
| 5,413,953 A | 5/1995 | Chien | |
| 5,506,449 A * | 4/1996 | Nakano et al. | 257/758 |
| 5,576,928 A | 11/1996 | Summerfelt | |
| 5,889,328 A | 3/1999 | Joshi | |
| 6,110,768 A | 8/2000 | Chang | |
| 6,136,687 A | 10/2000 | Lee | |
| 6,268,621 B1 | 7/2001 | Emmi | |
| 6,800,940 B2 | 10/2004 | Catabay | |
| 6,858,524 B2 * | 2/2005 | Haukka et al. | 438/585 |
| 7,135,407 B2 | 11/2006 | Shin | |
| 7,214,602 B2 | 5/2007 | Marsh | |
| 2002/0137260 A1 | 9/2002 | Leung | |
| 2004/0157353 A1 | 8/2004 | Ouyang | |
| 2006/0003565 A1 | 1/2006 | Sasaki | |
| 2006/0009034 A1 * | 1/2006 | Lai et al. | 438/680 |
| 2006/0251800 A1 * | 11/2006 | Weidman et al. | 427/99.5 |
| 2007/0128864 A1 * | 6/2007 | Ma et al. | 438/680 |
| 2007/0194373 A1 | 8/2007 | Anderson | |
| 2007/0264818 A1 * | 11/2007 | Nakamura | 438/622 |
| 2009/0057780 A1 | 3/2009 | Wong | |
| 2010/0019231 A1 | 1/2010 | Smith | |

FOREIGN PATENT DOCUMENTS

JP 4302151 10/1992
JP 8115984 5/1996

* cited by examiner

*Primary Examiner* — Toniae Thomas
(74) *Attorney, Agent, or Firm* — Winston Hsu; Scott Margo

(57) ABSTRACT

A method for forming a semiconductor structure is provided. The method includes providing a substrate; forming a dielectric layer on the substrate; forming a conductor pattern on a main surface of the dielectric layer, the conductor pattern having a top surface and sidewalls; and performing a selective atomic layer deposition (ALD) process to selectively deposit a conformal metal layer onto the top surface and sidewalls of the conductor pattern, but without depositing onto the main surface of the dielectric layer substantially.

10 Claims, 1 Drawing Sheet

SEMICONDUCTOR STRUCTURE AND METHOD FOR MAKING THE SAME

CROSS REFERENCE TO RELATED APPLICATIONS

This application is a continuation of U.S. application Ser. No. 12/434,688 filed May 4, 2009.

BACKGROUND OF THE INVENTION

1. Field of the Invention

The present invention relates generally to semiconductor technology and, more particularly, to a semiconductor structure, e.g. a metal gate or a word line of a vertical-channel transistor, and a method for making the same.

2. Description of the Prior Art

As circuit integration increases, the need for greater uniformity and process control regarding layer thickness rises. Various technologies have been developed to deposit layers on substrates in a cost-effective manner, while maintaining control over the characteristics of the layer.

Selective deposition methods such as selective chemical vapor deposition (CVD) processes are known in the art. Selective deposition may be used to deposit materials on selected surfaces of structures in the manufacture of integrated circuits, and thus obviates the need for associated lithography, etching, and resist removal steps. Selective CVD processes are advantageous because they allow for self-alignment with respect to various structures, thus allowing for relatively tight design rules.

However, the prior art selective deposition methods still have some drawbacks. For example, the prior art selective deposition methods are often used to grow tungsten layer in a contact hole. Prior to the deposition or growth of the tungsten in the contact hole, a series of cleaning steps are required to ensure the silicon surface cleanness. If Reactive Ion Etching (RIE) damage layer exists on the bottom of the contact hole, the metal film formed by the selective CVD process does not grow because the RIE damage layer may work as an insulating film. Therefore, the RIE damage layer needs to be removed before growth of the metal film.

In addition, the prior art selective deposition methods are apparently not able to provide a selectively deposited layer such as tungsten layer, which is not only a conformal, ultra-thin (below 15 nm) film but structurally continuous, on a metallic, non-silicon base layer. Also, it is difficult to maintain sufficiently high selectivity between dielectric layer and metal base layer and to deposit such conformal, ultra-thin film at the same time.

In light of the above, there is a need in this industry to provide an improved semiconductor structure and method for making the same, where a conformal, ultra-thin film is desired and the conformal, ultra-thin film can be selectively deposited on a metallic, non-silicon base layer with high selectivity between dielectric layer and metal base layer. It is also desirable to provide a method for making such conformal, ultra-thin film with higher throughput.

SUMMARY OF THE INVENTION

It is one objective of this invention to provide an improved semiconductor structure, e.g. a metal gate or a word line of a vertical-channel transistor, and a method for making the same in order to solve the above-mentioned prior art problems.

According to one aspect of this invention, a semiconductor structure is provided. The semiconductor structure includes a substrate; a dielectric layer overlying the substrate; a conductor pattern on a main surface of the dielectric layer, the conductor pattern having a top surface and sidewalls; and a conformal metal layer selectively deposited on the top surface and sidewalls, but without deposited on the main surface of the dielectric layer substantially.

According to another aspect of this invention, a method for forming a semiconductor structure is provided. The method includes providing a substrate; forming a dielectric layer on the substrate; forming a conductor pattern on a main surface of the dielectric layer, the conductor pattern having a top surface and sidewalls; and performing a selective atomic layer deposition (ALD) process to selectively deposit a conformal metal layer onto the top surface and sidewalls of the conductor pattern, but without depositing onto the main surface of the dielectric layer substantially.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
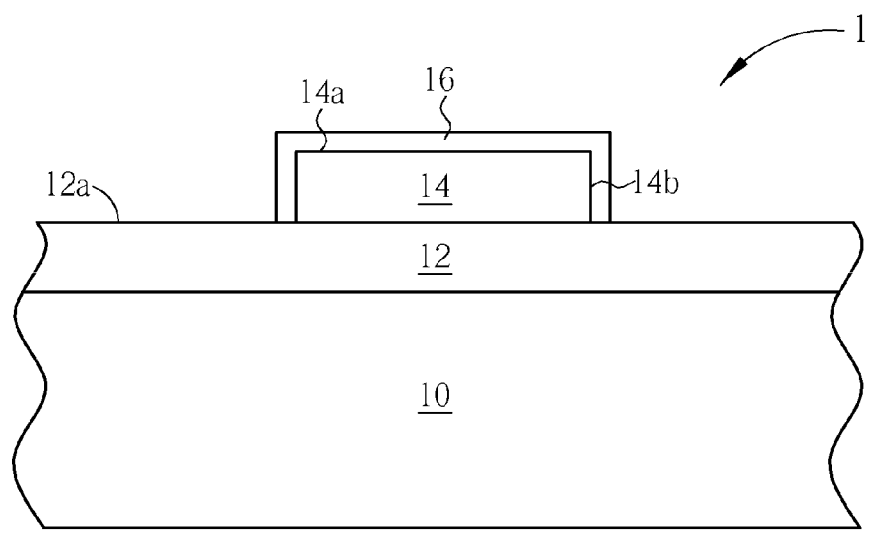
FIG. 1 is a schematic, cross-sectional diagram illustrating a semiconductor structure of an integrated circuit in accordance with one preferred embodiment of this invention.

FIG. 1 is a schematic, cross-sectional diagram illustrating a semiconductor structure of an integrated circuit in accordance with one preferred embodiment of this invention. As shown in FIG. 1, the semiconductor structure 1 comprises a semiconductor substrate 10 such as silicon substrate, a dielectric layer 12 on the semiconductor substrate 10, a conductor pattern 14 formed on a main surface 12a of the dielectric layer 12, and an ultra-thin metal layer 16 selectively deposited on a top surface 14a and sidewalls 14b of the conductor pattern 14. Substantially, the metal layer 16 is not deposited or grown directly on the main surface 12a of the dielectric layer 12.

According to this invention, the semiconductor structure 1 may be a metal-gated transistor device and the dielectric layer 12 is a gate dielectric layer or gate oxide layer of the metal-gated transistor device. This invention is particularly suited for a metal-gated vertical-channel transistor device. Such vertical-channel transistor device may be used in advanced dynamic random access memory (DRAM) technology, wherein the metal layer 16 is capable of reducing the resistance of the word lines. Further, it is often required that the metal layer 16 is ultra thin (below 15 nm) and is a continuous and conformal layer for the concern of work function of the metal-gated transistor device.

In accordance with the preferred embodiment of this invention, the dielectric layer 12 comprises silicon oxide, silicon nitride or silicon oxy-nitride. The conductor pattern 14 comprises titanium, titanium nitride, tantalum, tantalum nitride, aluminum, copper, gold, tungsten, silicide or any combination thereof. Preferably, the conductor pattern 14 is made of titanium nitride and the metal layer 16 is an atomic layer deposited tungsten layer having a thickness of less than 15 nanometers. Preferably, the conductor pattern 14, which may be part of a metal gate or word line, has a thickness of less than 15 nanometers, more preferably, in a range of about 6-8 nanometers.

Figure 2:
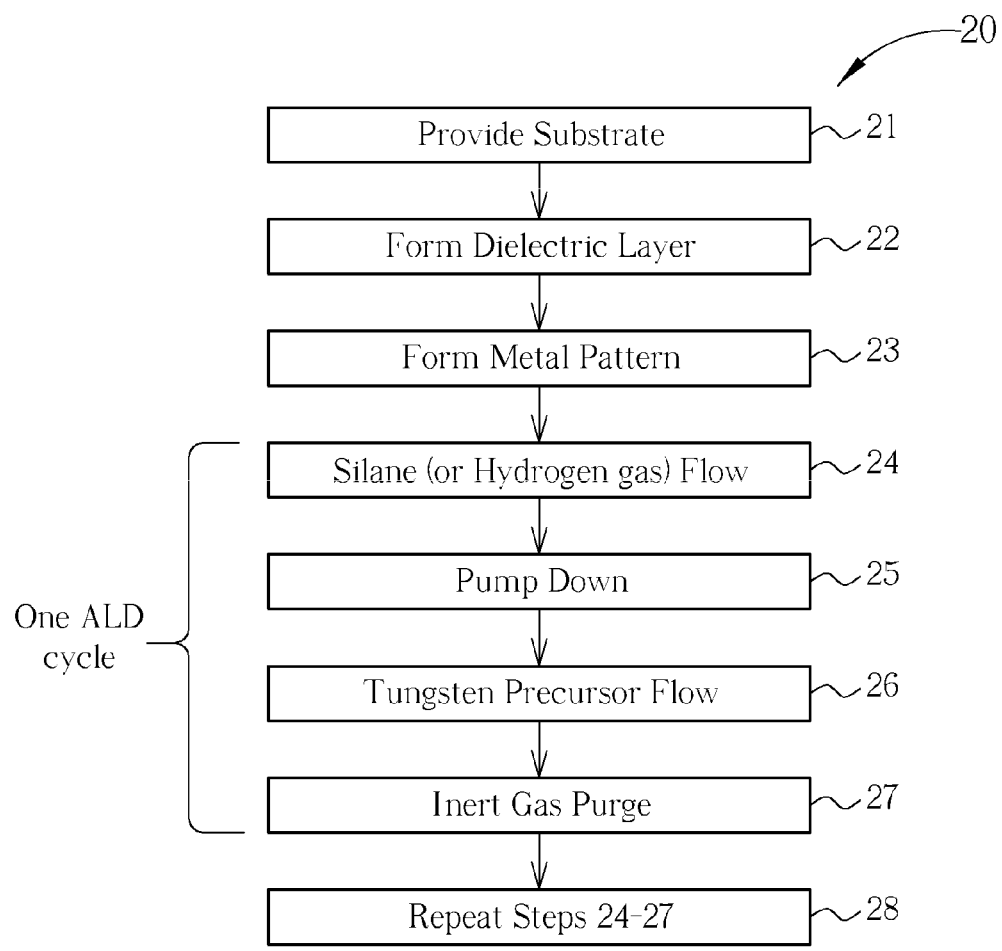
FIG. 2 is a flow diagram of a method for making a semiconductor structure of FIG. 1 in accordance with the preferred embodiment of this invention.

Please refer to FIG. 2. FIG. 2 is a flow diagram of a method 20 for making a semiconductor structure of FIG. 1 in accordance with the preferred embodiment of this invention. As shown in FIG. 2, in Step 21, a semiconductor substrate such as the substrate 10 depicted in FIG. 1 is provided. In Step 22, a dielectric layer such as the dielectric layer 12 depicted in FIG. 1 is thermally grown on the semiconductor substrate. The dielectric layer comprises silicon oxide, silicon nitride or silicon oxy-nitride.

In Step 23, a metal pattern such as the conductor pattern 14 depicted in FIG. 1 is formed on the main surface of the dielectric layer. The metal pattern comprises titanium, titanium nitride, tantalum, tantalum nitride, aluminum, copper, gold, tungsten, silicide or any combination thereof. Preferably, the metal pattern is titanium nitride and the metal pattern is defined by wet etching methods. For example, a metal layer such as a titanium nitride layer is capped with a mask layer such as a polysilicon layer. The mask layer only mask a top surface of the metal layer but exposes sidewalls of the metal layer. A wet etching process is then carried out to etch the sidewalls of the metal layer to define the metal pattern. The mask layer is then removed to expose the top surface of the metal pattern.

After the formation of the metal pattern, a selective tungsten atomic layer deposition process is carried out to grow a conformal, ultra-thin tungsten layer such as the metal layer 16 depicted in FIG. 1 on the metal pattern. According to this invention, the conformal, ultra-thin tungsten layer has a thickness of less than 15 nm and has good step coverage characteristic. The selective tungsten atomic layer deposition process may involve a plurality of ALD cycles to achieve a desired thickness of the tungsten layer on the metal pattern. For the sake of simplicity, merely one of the ALD cycles (Steps 24-27) is illustrated in the flow diagram in FIG. 2.

According to the preferred embodiment of this invention, the ALD cycle includes: (1) flowing hydrogen-containing substance such as silane or hydrogen gas into a chamber for a period of time to adsorb hydrogen radicals on the main surface of the dielectric layer and on the metal pattern (Step 24); (2) pumping down the chamber while stopping all gas flow to selectively remove the hydrogen radicals merely from the main surface of the dielectric layer (Step 25); (3) flowing tungsten precursor such as tungsten hexafluoride ($WF_6$) into the chamber at a low pressure (below 5 torr) and low temperature (below 300° C.) to react with the remanent hydrogen radicals adsorbed merely on the metal pattern, thereby selectively depositing a tungsten layer thereto (Step 26); and (4) purging the chamber with inert gas such as argon to remove by-products (Step 27). It is understood that the desired thickness of the tungsten layer can be achieved by repeating the ALD cycle (Step 28).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
    providing a substrate;
    forming a dielectric layer on the substrate;
    forming a conductor pattern on a main surface of the dielectric layer, the conductor pattern having a top surface and sidewalls; and
    performing a selective atomic layer deposition (ALD) process to selectively deposit a conformal metal layer only onto the top surface and sidewalls of the conductor pattern without depositing onto the main surface of the dielectric layer substantially; wherein the selective ALD process comprises the following steps:
        (1) flowing hydrogen-containing substance into a chamber for a period of time to adsorb hydrogen radicals on the main surface of the dielectric layer and on the conductor pattern;
        (2) pumping down the chamber while stopping all gas flow to selectively remove the hydrogen radicals merely from the main surface of the dielectric layer;
        (3) flowing tungsten precursor into the chamber at a low pressure and low temperature to react with the hydrogen radicals adsorbed on the conductor pattern, thereby selectively depositing a tungsten layer thereto; and
        (4) purging the chamber to remove by-products.

2. The method according to claim 1 wherein the hydrogen-containing substance comprises silane.

3. The method according to claim 1 wherein the hydrogen-containing substance comprises hydrogen gas.

4. The method according to claim 1 wherein the tungsten precursor comprises tungsten hexafluoride ($WF_6$).

5. The method according to claim 1 wherein said low pressure is below 5 torr.

6. The method according to claim 1 wherein said low temperature is below 300° C.

7. The method according to claim 1 wherein the dielectric layer comprises silicon oxide, silicon nitride or silicon oxy-nitride.

8. The method according to claim 1 wherein the conductor pattern comprises titanium, titanium nitride, tantalum, tantalum nitride, aluminum, copper, gold, tungsten, silicide or any combination thereof.

9. The method according to claim 1 wherein the conformal metal layer comprises tungsten.

10. The method according to claim 1 wherein the conformal metal layer has a thickness of less than 15 nanometers.

\* \* \* \* \*